United States Patent
Yasuda

(10) Patent No.: US 10,665,274 B2
(45) Date of Patent: May 26, 2020

(54) SEMICONDUCTOR DEVICE AND MEMORY SYSTEM FOR COMBINING REVERSED-PHASE DATA

(71) Applicant: TOSHIBA MEMORY CORPORATION, Minato-ku, Tokyo (JP)

(72) Inventor: Yohei Yasuda, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/116,363

(22) Filed: Aug. 29, 2018

(65) Prior Publication Data
US 2019/0287580 A1    Sep. 19, 2019

(30) Foreign Application Priority Data

Mar. 15, 2018 (JP) .................. 2018-047571

(51) Int. Cl.
| | |
|---|---|
| *G11C 7/10* | (2006.01) |
| *G11C 7/22* | (2006.01) |
| *G11C 19/28* | (2006.01) |
| *G11C 7/06* | (2006.01) |
| *H03K 19/0944* | (2006.01) |
| *H03K 19/0185* | (2006.01) |
| *G11C 5/06* | (2006.01) |
| *H03K 3/3562* | (2006.01) |

(52) U.S. Cl.
CPC ............. *G11C 7/1051* (2013.01); *G11C 5/06* (2013.01); *G11C 7/065* (2013.01); *G11C 7/222* (2013.01); *G11C 19/28* (2013.01); *H03K 3/35625* (2013.01); *H03K 19/01855* (2013.01); *H03K 19/0944* (2013.01)

(58) Field of Classification Search
CPC ....... G11C 7/1051; G11C 7/065; G11C 7/222; G11C 5/06; G11C 19/28; H03K 19/01855; H03K 19/0944
See application file for complete search history.

(56) References Cited

U.S. PATENT DOCUMENTS

| | | | |
|---|---|---|---|
| 6,707,405 B2 | 3/2004 | Kuttner | |
| 8,565,032 B2* | 10/2013 | Abe | ................... G11C 7/22 365/193 |
| 8,872,562 B2 | 10/2014 | Ito et al. | |
| 9,679,617 B2 | 6/2017 | Yasuda et al. | |
| 2015/0241197 A1 | 8/2015 | Iikura et al. | |
| 2015/0381154 A1* | 12/2015 | Maeno | ............... H03K 3/35625 327/203 |

* cited by examiner

*Primary Examiner* — Sultana Begum
(74) *Attorney, Agent, or Firm* — Foley & Lardner LLP

(57) ABSTRACT

A semiconductor device having a first inverter electrically connected to a first node. A second inverter is electrically connected to a second node. A third clocked inverter is electrically connected to an output node of the first inverter. A fourth clocked inverter is electrically connected to an output node of the second inverter. A third inverter is electrically connected to an output node of a first clocked inverter and an output node of a second clocked inverter. A fourth inverter is electrically connected to an output node of the third clocked inverter and an output node of the fourth clocked inverter. A comparison circuit is electrically connected to an output node of the third inverter and an output node of the fourth inverter.

20 Claims, 8 Drawing Sheets

SEMICONDUCTOR DEVICE AND MEMORY SYSTEM FOR COMBINING REVERSED-PHASE DATA

CROSS-REFERENCE TO RELATED APPLICATION

This application is based upon and claims the benefit of priority from Japanese Patent Application No. 2018-047571, filed Mar. 15, 2018, the entire contents of which are incorporated herein by reference.

FIELD

Embodiments described herein relate generally to a semiconductor device and a memory system.

BACKGROUND

A semiconductor device can receive two pieces of data and combine the two pieces of data to generate data for use by an internal circuit. At this time, in order for the data obtained by such combination to be appropriately used by the internal circuit, it is desired that the duty ratio (duty cycle) of the data obtained by combination be appropriate.

DETAILED DESCRIPTION

Figure 1:
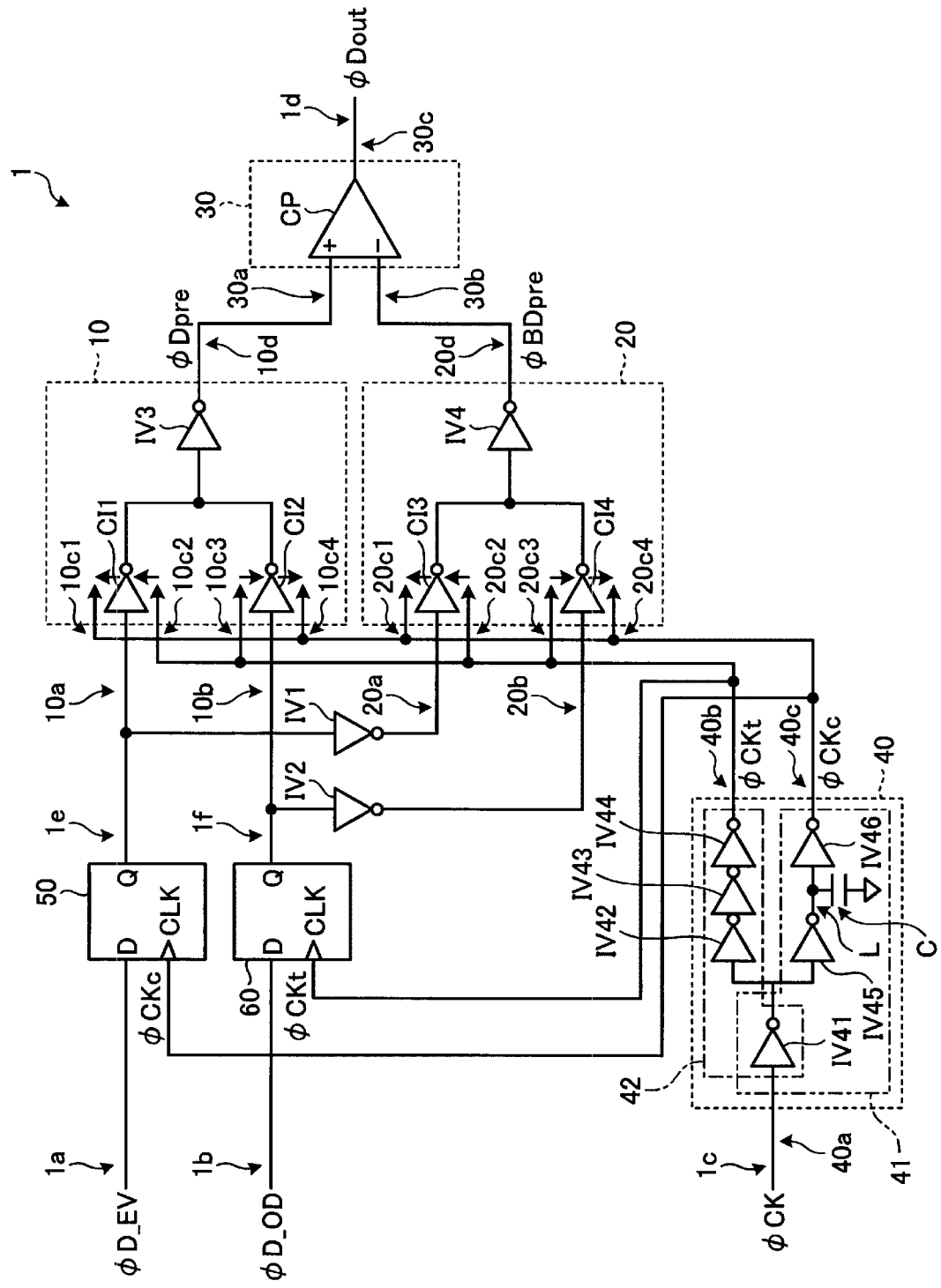
FIG. 1 is a circuit diagram illustrating a configuration of a semiconductor device according to at least one embodiment.

At least one embodiment provides a semiconductor device and a memory system each of which is capable of combining two pieces of data at an appropriate duty ratio.

In general, according to at least one embodiment, a semiconductor device including a first clocked inverter, a second clocked inverter, a first inverter, a second inverter, a third clocked inverter, a fourth clocked inverter, a third inverter, a fourth inverter, and a comparison circuit is provided. The first clocked inverter is electrically connected to a first node. First data are input to the first node. The first clocked inverter responds to rising of a reference clock. The second clocked inverter is electrically connected to a second node. Second data are input to the second node. The second clocked inverter responds to falling of the reference clock. The first inverter is electrically connected to the first node. The second inverter is electrically connected to the second node. The third clocked inverter is electrically connected to an output node of the first inverter. The third clocked inverter responds to rising of the reference clock. The fourth clocked inverter is electrically connected to an output node of the second inverter. The fourth clocked inverter responds to falling of the reference clock. The third inverter is electrically connected to an output node of the first clocked inverter and an output node of the second clocked inverter. The fourth inverter is electrically connected to an output node of the third clocked inverter and an output node of the fourth clocked inverter. The comparison circuit is electrically connected to an output node of the third inverter and an output node of the fourth inverter.

Hereinafter, a semiconductor device according to at least one embodiment will be described in detail with reference to the accompanying drawings. Furthermore, the present disclosure is not limited by this embodiment.

Embodiment

A semiconductor device according to at least one embodiment is configured according to a standard such as double data rate (DDR) in view of data transfer to be performed at high speed. According to the double data rate (DDR) standard, acquisition of data is performed on the double edges, i.e., rising and falling, of a clock (clock signal), so that the double transfer speed (double data rate) can be achieved as compared with a case where acquisition of data is performed only on rising or falling of the clock.

For example, in a case where both data $\phi D\_EV$ acquired on an even-numbered edge of a clock (for example, falling of the clock) and data $\phi D\_OD$ acquired on an odd-numbered edge of the clock (for example, rising of the clock) are input by transfer, the semiconductor device receives two such pieces of data and combines the two pieces of data to generate data for use by an internal circuit.

At this time, if, between a plurality of elements provided in the semiconductor device, variations occur in balance of an operation due to variations in the process of manufacture thereof, rising or falling of waveforms of the two pieces of data may become delayed, so that the duty ratio of the data obtained by combination may depart from an appropriate range. This may increase duty cycle distortion (DCD), and, since, for example, a setup time and/or a hold time of the data becomes not satisfying the required specification, the data obtained by combination may become unable to be appropriately used by the internal circuit.

Therefore, in at least one embodiment, the semiconductor device generates two pieces of reversed-phase data from two pieces of data, and combines, using a comparison circuit, one piece of data of the two pieces of data with reversed-phase data generated from the other piece of the two pieces of data, thus aiming at reducing DCD in the data obtained by combination.

Specifically, the semiconductor device 1 is configured as illustrated in FIG. 1. FIG. 1 is a circuit diagram illustrating a configuration of the semiconductor device 1. The semiconductor device 1 receives data $\phi D\_EV$ at a node 1a, receives data $\phi D\_OD$ at a node 1b, receives a reference clock $\phi CK$ at a node 1c, combines the data $\phi D\_EV$ and the data $\phi D\_OD$ using the reference clock $\phi CK$, and outputs data $\phi Dout$ obtained by combination from a node 1d.

The semiconductor device 1 includes a generation circuit 40, a latch circuit 50, a latch circuit 60, a selector 10, an inverter IV1, an inverter IV2, a selector 20, and a comparison circuit 30.

The generation circuit 40 receives the reference clock φCK at a node 40a (node 1c), and generates a clock (first clock) φCKc obtained by inverting the reference clock φCK and a clock (second clock) φCKt corresponding to the reference clock φCK. The generation circuit 40 is configured as a phase splitter, and includes, for example, a chain circuit 41 and a chain circuit 42. The chain circuit 41 has such a configuration that an inverter IV41, an inverter IV45, and an inverter IV46 are sequentially series-connected in a chain-like manner and one end of a capacitive element C is connected to a line L connecting the inverter IV45 and the inverter IV46. The other end of the capacitive element C can be connected to a ground potential. With this, the chain circuit 41 generates the clock φCKc by causing the reference clock φCK to pass through an odd number of stages including the inverters IV41, IV45, and IV46.

Figure 2:
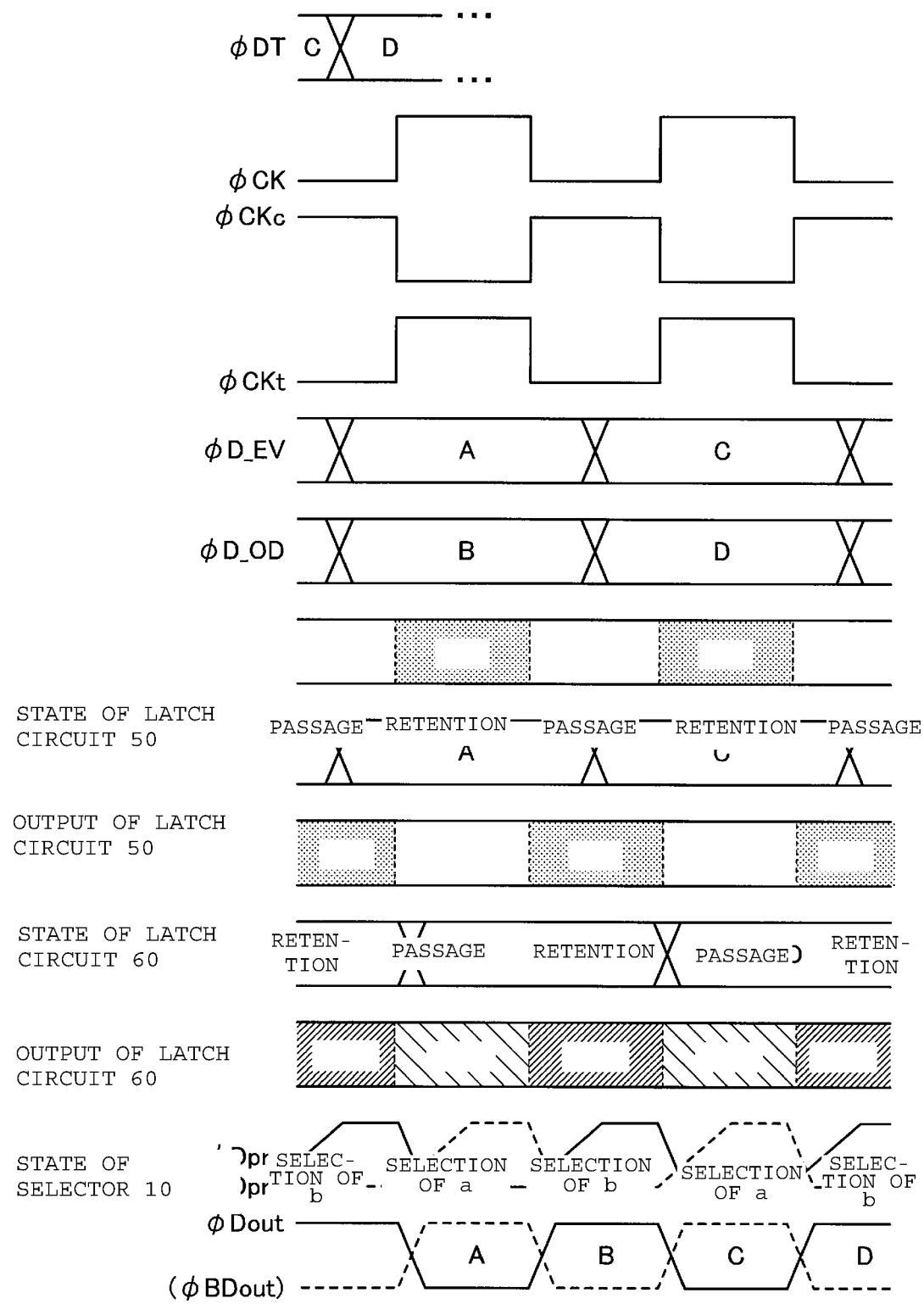
FIG. 2 is a waveform chart illustrating an operation of the semiconductor device according to at least one embodiment.
Figure 3:
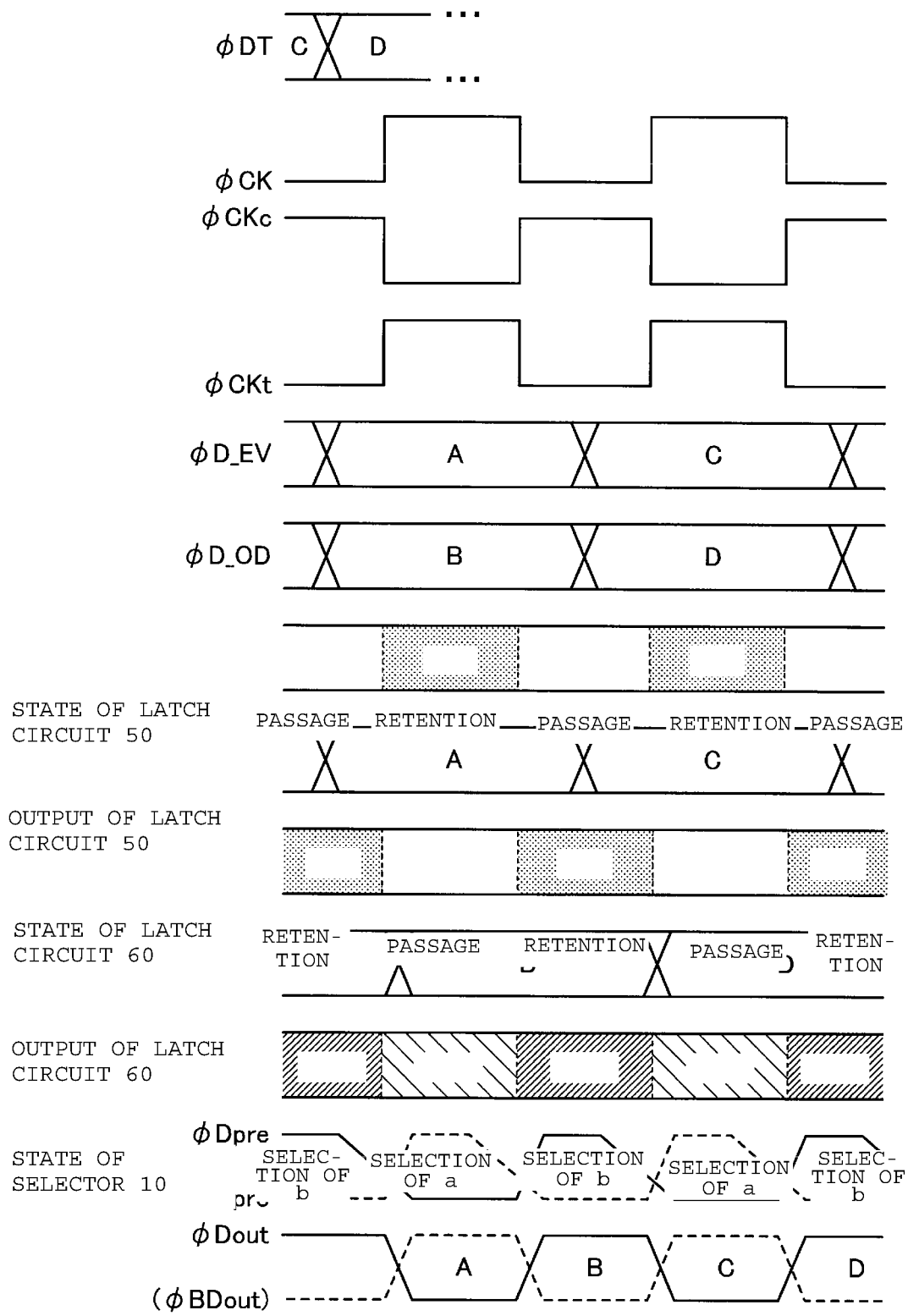
FIG. 3 is a waveform chart illustrating an operation of the semiconductor device according to at least one embodiment.

For example, as illustrated in FIG. 2 and FIG. 3, the chain circuit 41 receives the reference clock φCK, the duty ratio of which is about 50%, and generates the clock φCKc, the logic of which is inverted with respect to that of the reference clock φCK and the edge timing of which is slightly delayed with respect thereto. FIG. 2 and FIG. 3 are waveform diagrams each illustrating an operation of the semiconductor device 1. The generated clock φCKc has a duty ratio of about 50%.

The chain circuit 42 illustrated in FIG. 1 has such a configuration that the inverter IV41, an inverter IV42, an inverter IV43, and an inverter IV44 are sequentially series-connected in a chain-like manner. With this, the chain circuit 42 generates the clock φCKt by causing the reference clock φCK to pass through an even number of stages including the inverters IV41 to IV44.

For example, as illustrated in FIG. 2 and FIG. 3, the chain circuit 42 receives the reference clock φCK, the duty ratio of which is about 50%, and generates the clock φCKt, the edge timing of which is slightly delayed with respect to that of the reference clock φCK. The generated clock φCKt has a duty ratio of about 50%.

The generation circuit 40 illustrated in FIG. 1 supplies the clock φCKc from the node 40c to each of the latch circuit 50, the selector 10, and the selector 20, and supplies the clock φCKt from the node 40b to each of the latch circuit 60, the selector 10, and the selector 20.

The latch circuit 50 has a data input terminal D electrically connected to the node 1a, a clock terminal CLK electrically connected to the node 40c of the generation circuit 40, and an output terminal Q electrically connected to the selector 10 and the inverter IV1 via a node 1e. Each of the nodes 1a and 1e is anode compatible with the data φD_EV. The data φD_EV is data acquired on the even-numbered edge of a clock (falling of the clock) from original data φDT. The original data φDT is, for example, as illustrated in part in FIG. 2, data that transitions as A→B→C→D with a period of a half clock. Here, each of A, B, C, and D represents a logical value "0" or "1" of data, the logical value "0" can be transmitted with a signal waveform at low (L) level, and the logical value "1" can be transmitted with a signal waveform at high (H) level. The data φD_EV is, for example, as illustrated in FIG. 2, data that transitions as A→C with a period of one clock.

The latch circuit 50 receives the data φD_EV externally (via a host or a signal processing circuit in a memory system), and receives the clock φCKc from the generation circuit 40. The latch circuit 50 supplies, to the selector 10 and the inverter IV1, a logical value obtained by performing passage or retention of the level of the data φD_EV according to the level or edge of the clock φCKc.

For example, as illustrated in FIG. 2 and FIG. 3, in a period in which the clock φCKc is at H level, the latch circuit 50 performs passage of the data φD_EV to supply the data φD_EV to the selector 10 and the inverter IV1. In a period in which the clock φCKc is at L level, the latch circuit 50 does not perform passage of the data φD_EV and supplies, to the selector 10 and the inverter IV1, the level of data φD_EV retained at timing when the clock φCKc is changed from H level to L level.

The latch circuit 60 illustrated in FIG. 1 has a data input terminal D electrically connected to the node 1b, a clock terminal CLK electrically connected to the node 40b of the generation circuit 40, and an output terminal Q electrically connected to the selector 10 and the inverter IV2 via a node 1f. Each of the nodes 1b and 1f is a node compatible with the data φD_OD. The data φD_OD is data acquired on the odd-numbered edge of the clock (rising of the clock) from original data φDT. The data φD_OD is, for example, as illustrated in FIG. 2, data that transitions as B→D with a period of one clock.

The latch circuit 60 receives the data φD_OD externally (via a host or a signal processing circuit in a memory system), and receives the clock φCKt from the generation circuit 40. The latch circuit 60 supplies, to the selector 10 and the inverter IV2, a logical value obtained by performing passage or retention of the level of the data φD_OD according to the level or edge of the clock φCKt.

For example, as illustrated in FIG. 2 and FIG. 3, in a period in which the clock φCKt is at H level, the latch circuit 60 performs passage of the data φD_OD to supply the data φD_OD to the selector 10 and the inverter IV2. In a period in which the clock φCKt is at L level, the latch circuit 60 does not perform passage of the data φD_OD and supplies, to the selector 10 and the inverter IV2, the level of data φD_OD retained at timing when the clock φCKt is changed from H level to L level.

The selector 10 is electrically inserted between each of the latch circuit 50 and the latch circuit 60 and the comparison circuit 30. The selector 10 has input nodes 10a and 10b, clock nodes 10c1, 10c2, 10c3, and 10c4, and an output node 10d. The input node 10a is electrically connected to the output terminal Q of the latch circuit 50. The input node 10b is electrically connected to the output terminal Q of the latch circuit 60. The clock node 10c1 and the clock node 10c4 are electrically connected to the output node 40c of the generation circuit 40. The clock node 10c2 and the clock node 10c3 are electrically connected to the output node 40b of the generation circuit 40. The output node 10d is electrically connected to the comparison circuit 30.

The selector 10 receives the data φD_EV from the latch circuit 50, receives the data φD_OD from the latch circuit 60, and receives the clocks φCKt and φCKc from the generation circuit 40. The selector 10 performs an operation using the clocks φCKt and φCKc, but can be deemed to perform an operation while equivalently using the reference clock φCK as a select signal. In other words, the selector 10 selects the data φD_EV and outputs the data φD_EV as data φDpre in a period when the reference clock φCK is at H level, and selects the data φD_OD and outputs the data φD_OD as data φDpre in a period when the reference clock φCK is at L level.

The selector 10 includes a clocked inverter CI1, a clocked inverter CI2, and an inverter IV3. The clocked inverter CI1 is electrically inserted between the latch circuit 50 and the inverter IV3. The clocked inverter CI2 is electrically inserted between the latch circuit 60 and the inverter IV3.

The inverter IV3 is electrically inserted between each of the clocked inverter CI1 and the clocked inverter CI2 and the comparison circuit 30.

The clocked inverter CI1 has an input node electrically connected to the node 1e via an input node 10a, a clock node 10c1 at the P side (first side) electrically connected to the node 40c, a clock node 10c2 at the N side (second side) electrically connected to the node 40b, and an output node electrically connected to an input node of the inverter IV3. The clocked inverter CI1 responds to rising of the reference clock ϕCK.

Figure 4:
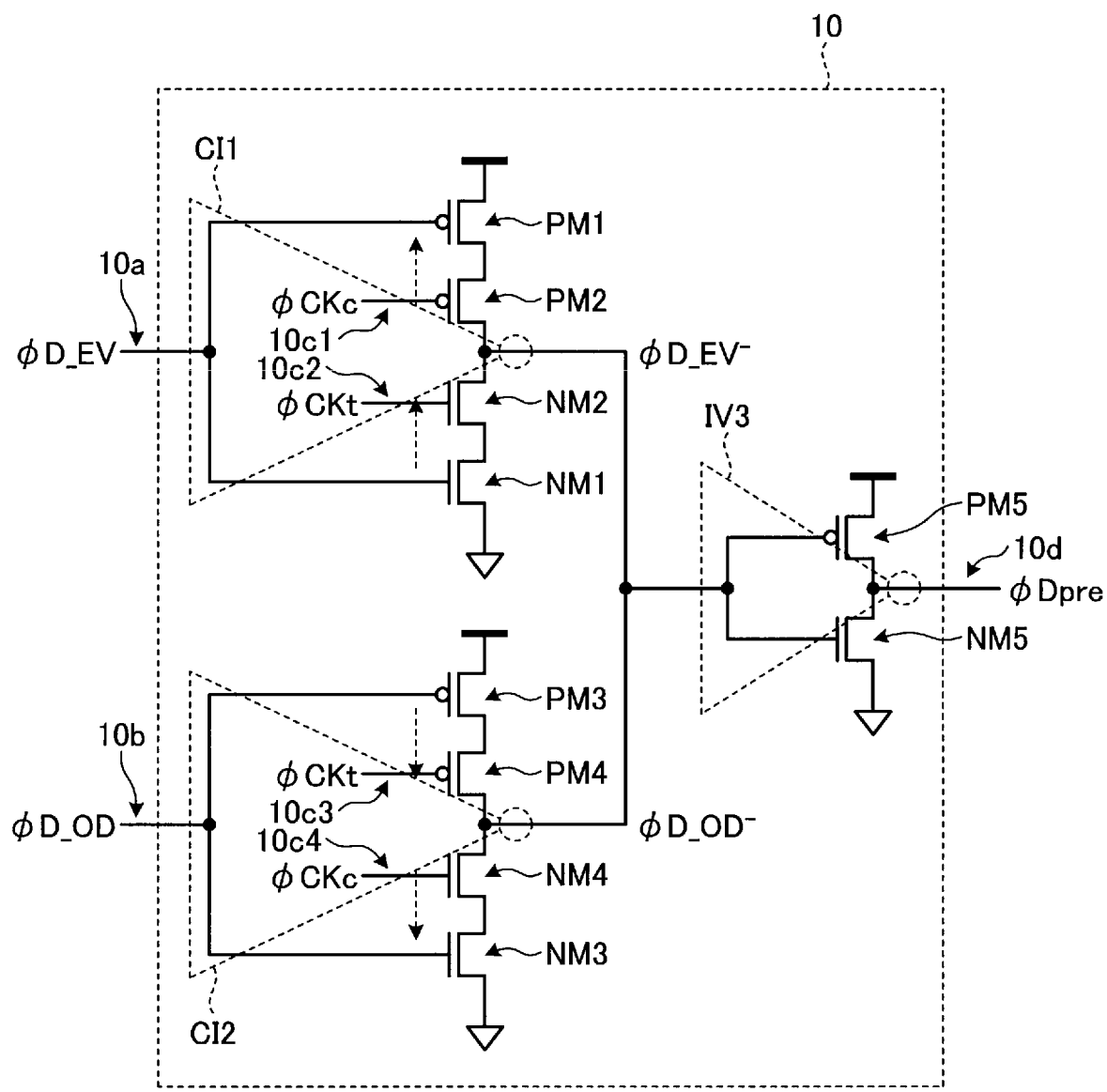
FIG. 4 is a circuit diagram illustrating configurations of a clocked inverter and an inverter in at least one embodiment.

The clocked inverter CI1 is configured, for example, as illustrated in FIG. 4. FIG. 4 is a circuit diagram illustrating configurations of the clocked inverters CI1 and CI2 and the inverter IV3. The clocked inverter CI1 includes a PMOS transistor PM1, a PMOS transistor PM2, an NMOS transistor NM1, and an NMOS transistor NM2. The PMOS transistor PM1 has agate electrically connected to the input node 10a, a source electrically connected to a power-supply potential, and a drain electrically connected to the source of the PMOS transistor PM2. The PMOS transistor PM2 has a gate electrically connected to the clock node 10c1, a source electrically connected to the drain of the PMOS transistor PM1, and a drain electrically connected to the output node of the clocked inverter CI1. The NMOS transistor NM2 has a gate electrically connected to the clock node 10c2, a source electrically connected to the drain of the NMOS transistor NM1, and a drain electrically connected to the output node of the clocked inverter CI1. The NMOS transistor NM1 has a gate electrically connected to the input node 10a, a source electrically connected to the ground potential, and a drain electrically connected to the source of the NMOS transistor NM2. Thus, the drain of the PMOS transistor PM2 and the drain of the NMOS transistor NM2 are connected to each other.

According to the configuration illustrated in FIG. 4, in a period when the clock ϕCKc is at L level and the clock ϕCKt is at H level, the clocked inverter CI1 outputs data ϕD_EV⁻ obtained by inverting the data ϕD_EV to the inverter IV3 via the output node, and in a period when the clock ϕCKc is at H level and the clock ϕCKt is at L level, the clocked inverter CI1 does not operate. From an equivalent viewpoint, in a period when the reference clock ϕCK is at H level, the clocked inverter CI1 illustrated in FIG. 1 outputs data ϕD_EV⁻ obtained by inverting the data ϕD_EV to the inverter IV3 via the output node, and in a period when the reference clock ϕCK is at L level, the clocked inverter CI1 does not operate.

As illustrated in FIG. 1, the clocked inverter CI2 has an input node electrically connected to the node 1f via an input node 10b, a clock node 10c3 at the P side (first side) electrically connected to the node 40b, a clock node 10c4 electrically connected to the node 40c, and an output node electrically connected to the input node of the inverter IV3. The clocked inverter CI2 responds to falling of the reference clock ϕCK.

The clocked inverter CI2 is configured, for example, as illustrated in FIG. 4. The clocked inverter CI2 includes a PMOS transistor PM3, a PMOS transistor PM4, an NMOS transistor NM3, and an NMOS transistor NM4. The PMOS transistor PM3 has a gate electrically connected to the input node 10b, a source electrically connected to the power-supply potential, and a drain electrically connected to the source of the PMOS transistor PM4. The PMOS transistor PM4 has a gate electrically connected to the clock node 10c3, a source electrically connected to the drain of the PMOS transistor PM3, and a drain electrically connected to the output node of the clocked inverter CI2. The NMOS transistor NM4 has a gate electrically connected to the clock node 10c4, a source electrically connected to the drain of the NMOS transistor NM3, and a drain electrically connected to the output node of the clocked inverter CI2. The NMOS transistor NM3 has a gate electrically connected to the input node 10b, a source electrically connected to the ground potential, and a drain electrically connected to the source of the NMOS transistor NM4. Thus, the drain of the PMOS transistor PM4 and the drain of the NMOS transistor NM4 are connected to each other.

According to the configuration illustrated in FIG. 4, in a period when the clock ϕCKc is at H level and the clock ϕCKt is at L level, the clocked inverter CI2 outputs data ϕD_OD⁻ obtained by inverting the data ϕD_OD to the inverter IV3 via the output node, and in a period when the clock ϕCKc is at L level and the clock ϕCKt is at H level, the clocked inverter CI2 does not operate. From an equivalent viewpoint, in a period when the reference clock ϕCK is at L level, the clocked inverter CI2 illustrated in FIG. 1 outputs data ϕD_OD⁻ obtained by inverting the data ϕD_OD to the inverter IV3 via the output node, and in a period when the reference clock ϕCK is at H level, the clocked inverter CI2 does not operate.

As also illustrated in FIG. 1, the inverter IV3 has an input node electrically connected to the output node of the clocked inverter CI1 and the output node of the clocked inverter CI2, and an output node 10d electrically connected to an input node 30a of the comparison circuit 30.

The inverter IV3 is configured, for example, as illustrated in FIG. 4. The inverter IV3 includes a PMOS transistor PM5 and an NMOS transistor NM5. The PMOS transistor PM5 has a gate electrically connected to the input node of the inverter IV3, a source electrically connected to the power-supply potential, and a drain electrically connected to the output node of the inverter IV3. The NMOS transistor NM5 has a gate electrically connected to the input node of the inverter IV3, a source electrically connected to the ground potential, and a drain electrically connected to the output node of the inverter IV3. Thus, the drain of the PMOS transistor PM5 and the drain of the NMOS transistor NM5 are connected to each other.

According to the configuration illustrated in FIG. 1 and FIG. 4, when receiving the data ϕD_EV⁻ from the clocked inverter CI1, the inverter IV3 inverts the data ϕD_EV⁻ and outputs data obtained by inverting the data ϕD_EV⁻ as data ϕpre. Moreover, when receiving the data ϕD_OD⁻ from the clocked inverter CI2, the inverter IV3 inverts the data ϕD_OD⁻ and outputs data obtained by inverting the data ϕD_OD⁻ as data ϕpre.

Here, while PMOS transistors and NMOS transistors in the clocked inverter CI1, the clocked inverter CI2, and the inverter IV3 provided in the selector 10 are designed in such a manner that the respective driving forces thereof are made equal to each other, the driving forces may become imbalanced due to variations in manufacture thereof.

For example, in a case where driving force for the PMOS transistors provided in the clocked inverter CI1, the clocked inverter CI2, and the inverter IV3 is smaller than driving force for the NMOS transistors included therein, the waveform of the data ϕDpre has a tendency such that, as indicated by a solid line in FIG. 2, rising becomes slow compared with falling, and the duty ratio of the data ϕpre is attenuated from 50%.

Alternatively, in a case where the driving force for the PMOS transistors provided in the clocked inverter CI1, the clocked inverter CI2, and the inverter IV3 is larger than the driving force for the NMOS transistors included therein, the waveform of the data φpre has a tendency such that, as indicated by a solid line in FIG. 3, falling becomes slow compared with rising and the duty ratio of the data φpre is attenuated from 50%.

As illustrated in FIG. 1, the inverter IV1 is electrically inserted between the latch circuit 50 and the selector 20. The inverter IV1 has an input node electrically connected to the output terminal Q of the latch circuit 50 via the node 1e, and an output node electrically connected to an input node 20a of the selector 20. The inverter IV1 receives the data φD_EV from the latch circuit 50, and outputs data φD_EV⁻ obtained by logically inverting the data φD_EV to the selector 20.

The inverter IV2 is electrically inserted between the latch circuit 60 and the selector 20. The inverter IV2 has an input node electrically connected to the output terminal Q of the latch circuit 60 via the node 1f, and an output node electrically connected to an input node 20b of the selector 20. The inverter IV2 receives the data φD_OD from the latch circuit 60, and outputs data φD_OD⁻ obtained by logically inverting the data φD_OD to the selector 20.

The selector 20 is electrically inserted between each of the latch circuit 50 and the latch circuit 60 and the comparison circuit 30, and is located in parallel with the selector 10. The selector 20 has input nodes 20a and 20b, clock nodes 20c1, 20c2, 20c3, and 20c4, and an output node 20d. The input node 20a is electrically connected to the output node of the inverter IV1. The input node 20b is electrically connected to the output node of the inverter IV2. The clock node 20c1 and the clock node 20c4 are electrically connected to the output node 40c of the generation circuit 40. The clock node 20c2 and the clock node 20c3 are electrically connected to the output node 40b of the generation circuit 40. The output node 20d is electrically connected to the comparison circuit 30.

The selector 20 receives the data φD_EV⁻ from the inverter IV1, receives the data φD_OD⁻ from the inverter IV2, and receives the clocks φCKt and φCKc from the generation circuit 40. The selector 20 performs an operation using the clocks φCKt and φCKc, but can be deemed to perform an operation while equivalently using the reference clock φCK as a select signal. In other words, the selector 20 selects the data φD_EV⁻ and outputs the data φD_EV⁻ as data φBDpre in a period when the reference clock φCK is at H level, and selects the data φD_OD⁻ and outputs the data φD_OD⁻ as data φBDpre in a period when the reference clock φCK is at L level.

The selector 20 includes a clocked inverter CI3, a clocked inverter CI4, and an inverter IV4. The clocked inverter CI3 is electrically inserted between the inverter IV1 and the inverter IV4. The clocked inverter CI4 is electrically inserted between the inverter IV2 and the inverter IV4. The inverter IV4 is electrically inserted between each of the clocked inverter CI3 and the clocked inverter CI4 and the comparison circuit 30.

The clocked inverter CI3 has an input node electrically connected to the output node of the inverter IV1, a clock node 20c1 at the P side (first side) electrically connected to the node 40c, a clock node 20c2 at the N side (second side) electrically connected to the node 40b, and an output node electrically connected to an input node of the inverter IV4. The clocked inverter CI3 responds to rising of the reference clock φCK.

The configuration of the clocked inverter CI3 is similar to, for example, the configuration of the clocked inverter CI1 illustrated in FIG. 4. According to this configuration, in a period when the clock φCKc is at L level and the clock φCKt is at H level, the clocked inverter CI3 outputs data φD_EV obtained by logically inverting the data φD_EV⁻ to the inverter IV4 via the output node, and in a period when the clock φCKc is at H level and the clock φCKt is at L level, the clocked inverter CI3 does not operate. From an equivalent viewpoint, in a period when the reference clock φCK is at H level, the clocked inverter CI3 illustrated in FIG. 1 outputs data φD_EV obtained by logically inverting the data φD_EV⁻ to the inverter IV4 via the output node, and in a period when the reference clock φCK is at L level, the clocked inverter CI3 does not operate.

As illustrated in FIG. 1, the clocked inverter CI4 has an input node electrically connected to the output node of the inverter IV2, a clock node 20c3 at the P side (first side) electrically connected to the node 40b, a clock node 20c4 at the N side (second side) electrically connected to the node 40c, and an output node electrically connected to the input node of the inverter IV4. The clocked inverter CI4 responds to falling of the reference clock φCK.

The configuration of the clocked inverter CI4 is similar to, for example, the configuration of the clocked inverter CI2 illustrated in FIG. 4. According to this configuration, in a period when the clock φCKc is at H level and the clock φCKt is at L level, the clocked inverter CI4 outputs data φD_OD obtained by logically inverting the data φD_OD⁻ to the inverter IV4 via the output node, and in a period when the clock φCKc is at L level and the clock φCKt is at H level, the clocked inverter CI4 does not operate. From an equivalent viewpoint, in a period when the reference clock φCK is at L level, the clocked inverter CI4 illustrated in FIG. 1 outputs data φD_OD obtained by logically inverting the data φD_OD⁻ to the inverter IV4 via the output node, and in a period when the reference clock φCK is at H level, the clocked inverter CI4 does not operate.

The inverter IV4 has an input node electrically connected to the output node of the clocked inverter CI3 and the output node of the clocked inverter CI4, and an output node 20d electrically connected to an input node 30b of the comparison circuit 30.

The configuration of the inverter IV4 is similar to, for example, the configuration of the inverter IV3 illustrated in FIG. 4. According to this configuration, when receiving the data φD_EV from the clocked inverter CI3, the inverter IV4 inverts the data φD_EV and outputs data obtained by inverting the data φD_EV as data φBDpre. Moreover, when receiving the data φD_OD from the clocked inverter CI4, the inverter IV4 inverts the data φD_OD and outputs data obtained by inverting the data φD_OD as data φBDpre.

Here, while PMOS transistors and NMOS transistors in the clocked inverter CI3, the clocked inverter CI4, and the inverter IV4 provided in the selector 20 are designed in such a manner that the respective driving forces thereof are made equal to each other, the driving forces may become imbalanced due to variations in manufacture thereof.

For example, in a case where driving force for the PMOS transistors provided in the clocked inverter CI3, the clocked inverter CI4, and the inverter IV4 is smaller than driving force for the NMOS transistors included therein, the waveform of the data φDpre has a tendency such that, as indicated by a dashed line in FIG. 2, rising becomes slow compared with falling and the duty ratio of the data φDpre is attenuated from 50%.

Alternatively, in a case where the driving force for the PMOS transistors provided in the clocked inverter CI3, the clocked inverter CI4, and the inverter IV4 is larger than the driving force for the NMOS transistors included therein, the waveform of the data φDpre has a tendency such that, as indicated by a dashed line in FIG. 3, falling becomes slow compared with rising and the duty ratio of the data φDpre is attenuated from 50%.

The comparison circuit 30 is electrically inserted between each of the selector 10 and the selector 20 and the output node 1d of the semiconductor device 1. The comparison circuit 30 has an input node 30a, an input node 30b, and an output node 30c. The input node 30a is electrically connected to the output node 10d of the selector 10. The input node 30b is electrically connected to the output node 20d of the selector 20. The output node 30c of the comparison circuit 30 serves as the output node 1d of the semiconductor device 1.

The comparison circuit 30 receives the data φpre from the selector 10 and receives the data φDpre from the selector 20. The comparison circuit 30 compares the data φpre and the data φDpre with each other, and outputs, as a result of comparison, data φDout obtained by combining the data φpre and the data φBDpre. The data φDout is, for example, as illustrated FIG. 2, data corresponding to the original data φDT, and is data that transitions as A→B→C→D with a half clock period. Here, each of A, B, C, and D represents a logical value "0" or "1" of data, the logical value "0" can be transmitted with a signal waveform at L level, and the logical value "1" can be transmitted with a signal waveform at H level. In FIG. 2, a case where A="0", B="1", C="0", and D="1" is illustrated as an example.

The comparison circuit 30 includes a comparator CP. A differential amplifier configured in such a way as not to give feedback between an input and an output (in such a way as to perform a comparison operation) can be used as the comparator CP. The comparator CP is electrically inserted between each of the selector 10 and the selector 20 and the output node 1d of the semiconductor device 1. The comparator CP has a non-inverting input terminal (+) electrically connected to the output node 10d of the selector 10 via the input node 30a, an inverting input terminal (−) electrically connected to the output node 20d of the selector 20 via the input node 30b, and an output terminal electrically connected to the output node 30c (output node 1d).

The comparator CP receives the data φpre from the selector 10 and receives the data φBDpre from the selector 20. The comparator CP compares the data φpre and the data φBDpre with each other, and, if the level of the data φpre is higher than the level of the data φBDpre, outputs an H level as a comparison result (data φDout), and, if the level of the data φpre is lower than the level of the data φBDpre, outputs an L level as a comparison result (data φDout). With this, the comparator CP outputs data φDout obtained by combining the data φDpre and the data φBDpre.

For example, in a case where driving force for the PMOS transistors provided in each of the selector 10 and the selector 20 is smaller than driving force for the NMOS transistors included therein, the waveform of the data φDpre becomes such a form that, as indicated by a solid line in FIG. 2, rising becomes slow compared with falling and the waveform of the data φBDpre becomes a form such that, as indicated by a dashed line in FIG. 2, rising becomes slow compared with falling. Looking at two pieces of data φDpre and φBDpre enables finding that, in each piece of data, the pulse width at L level can be secured with a width corresponding to the duty ratio of 50%. Thus, the comparator CP outputs an H level as data φDout if the level of the data φDpre is higher than the level of the data φBDpre, and outputs an L level as data φDout if the level of the data φDpre is lower than the level of the data φBDpre, so that the data φDout, the duty ratio of which is about 50%, can be synthesized.

Alternatively, in a case where the driving force for the NMOS transistors provided in each of the selector 10 and the selector 20 is smaller than the driving force for the PMOS transistors included therein, the waveform of the data φDpre becomes a form such that, as indicated by a solid line in FIG. 3, falling becomes slow compared with rising and the waveform of the data φBDpre becomes such a form that, as indicated by a dashed line in FIG. 3, falling becomes slow compared with rising. Looking at two pieces of data φDpre and φBDpre enables finding that, in each piece of data, the pulse width at L level can be secured with a width corresponding to the duty ratio of 50%. Thus, the comparator CP outputs an H level as data φDout if the level of the data φDpre is higher than the level of the data φBDpre, and outputs an L level as data φDout if the level of the data φpre is lower than the level of the data φBDpre, so that the data φDout, the duty ratio of which is about 50%, can be synthesized.

As described above, according to at least one embodiment, the semiconductor device 1 generates two pieces of reversed-phase data φD_EV⁻ and φD_OD⁻ from two pieces of data φD_EV and φD_OD, and causes a comparison circuit to combine one piece of data of the two pieces of data and reversed-phase data generated from the other piece of data of the two pieces of data into data φDout, thus outputting the data φDout. With this, the data φDout obtained by combination can be generated as data the duty ratio of which is about 50%, so that DCD in the data φDout obtained by combination can be readily reduced.

Furthermore, the polarity of connection between the comparison circuit 30 and each of two selectors 10 and 20 can be reversed. For example, the input node 30a of the comparison circuit 30 (the non-inverting input terminal (+) of the comparator CP) can be connected to the output node 20d of the selector 20 and the input node 30b of the comparison circuit 30 (the inverting input terminal (−) of the comparator CP) can be connected to the output node 10d of the selector 10, so that the polarity of connection between the comparison circuit 30 and each of two selectors 10 and 20 can be reversed. Even with such a configuration employed, an advantageous effect similar to that in the embodiment can be achieved.

Figure 5:
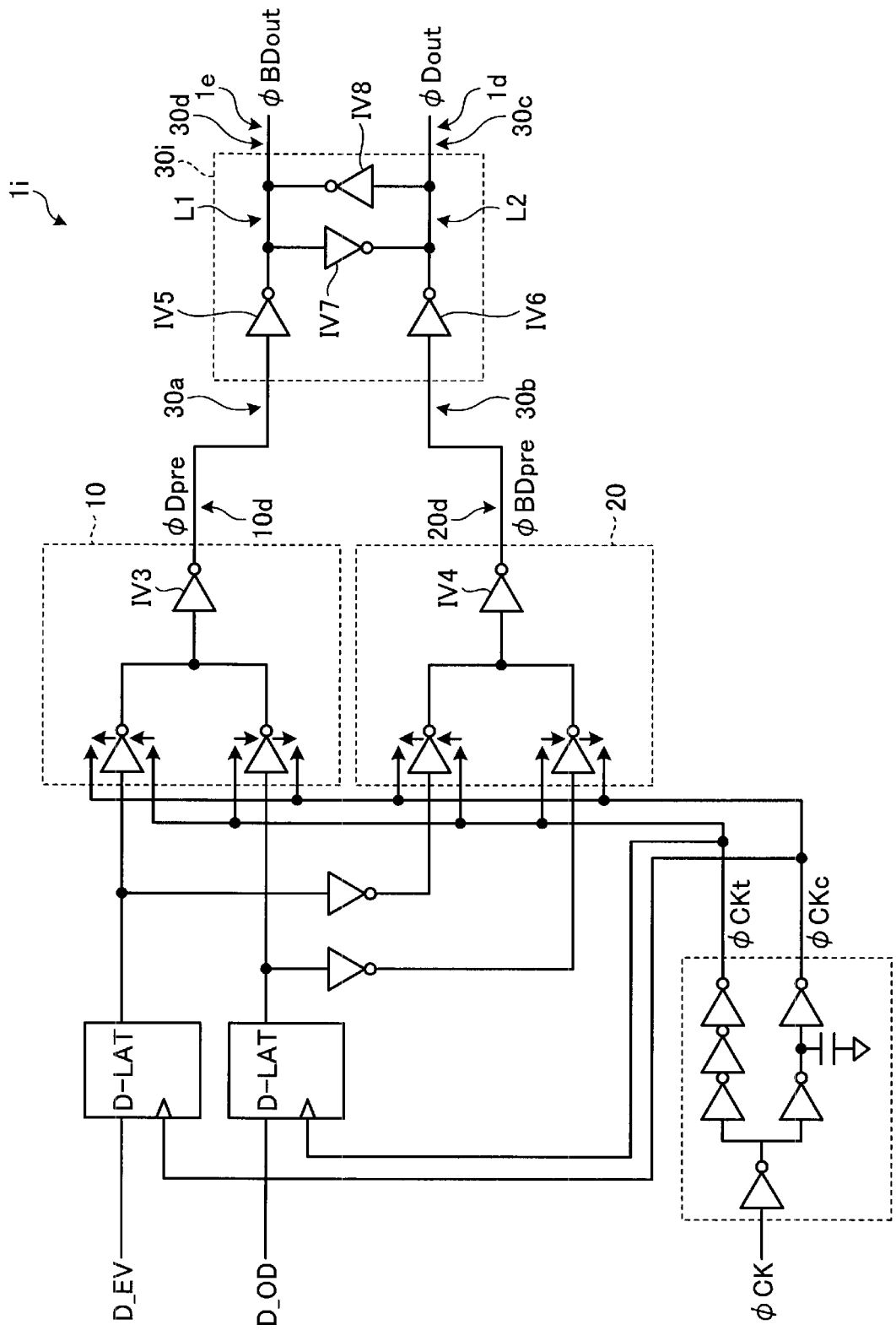
FIG. 5 is a circuit diagram illustrating a configuration of a semiconductor device according to a modification example of at least one embodiment.

Alternatively, as illustrated in FIG. 5, a semiconductor device 1i can be structured to reduce power consumption. In the semiconductor device 1i, a comparison circuit 30i can be configured with, instead of the comparator CP (a differential amplifier) illustrated in FIG. 1, a plurality of inverters of the "back-to-back" configuration. FIG. 5 is a circuit diagram illustrating a configuration of the semiconductor device 1i according to a modification example of the embodiment.

The comparison circuit 30i includes a plurality of inverters IV5, IV6, IV7, and IV8. The inverter IV6 has an input node electrically connected to the output node 20d of the selector 20 via the input node 30b, and an output node electrically connected to a line L2. The line L2 is located at the output side of the inverter IV6. The line L2 electrically connects the output node of the inverter IV6 and an output node 30c of the comparison circuit 30i (an output node 1d of the semiconductor device 1i). Data φDout can be output from the comparison circuit 30i via the output node 30c (output node 1d).

The inverter IV5 has an input node electrically connected to the output node 10d of the selector 10 via the input node 30a, and an output node electrically connected to a line L1.

The line L1 is located at the output side of the inverter IV5. The line L1 electrically connects the output node of the inverter IV5 and an output node 30d of the comparison circuit 30i (an output node 1e of the semiconductor device 1i). Data φDout can be output from the comparison circuit 30i via the output node 30d (output node 1e). The data φDout corresponds to data obtained by logically inverting the data φDout.

The inverter IV7 is electrically inserted between the line L1 and the line L2 in a first polarity. The first polarity can be set to a polarity in which, for example, the input node of the inverter IV7 is electrically connected to the line L1 and the output node of the inverter IV7 is electrically connected to the line L2.

The inverter IV8 is electrically inserted between the line L1 and the line L2 in a second polarity. The second polarity is a polarity reverse to the first polarity and can be set to a polarity in which, for example, the output node of the inverter IV8 is electrically connected to the line L1 and the input node of the inverter IV8 is electrically connected to the line L2.

In this way, in the semiconductor device 1i, the comparison circuit 30i is configured with a plurality of inverters of the "back-to-back" configuration. This enables omitting a configuration having relatively large power consumption (for example, a current source or the like in a differential amplifier) and also enables readily reducing the power consumption of the semiconductor device 1i.

Figure 6:
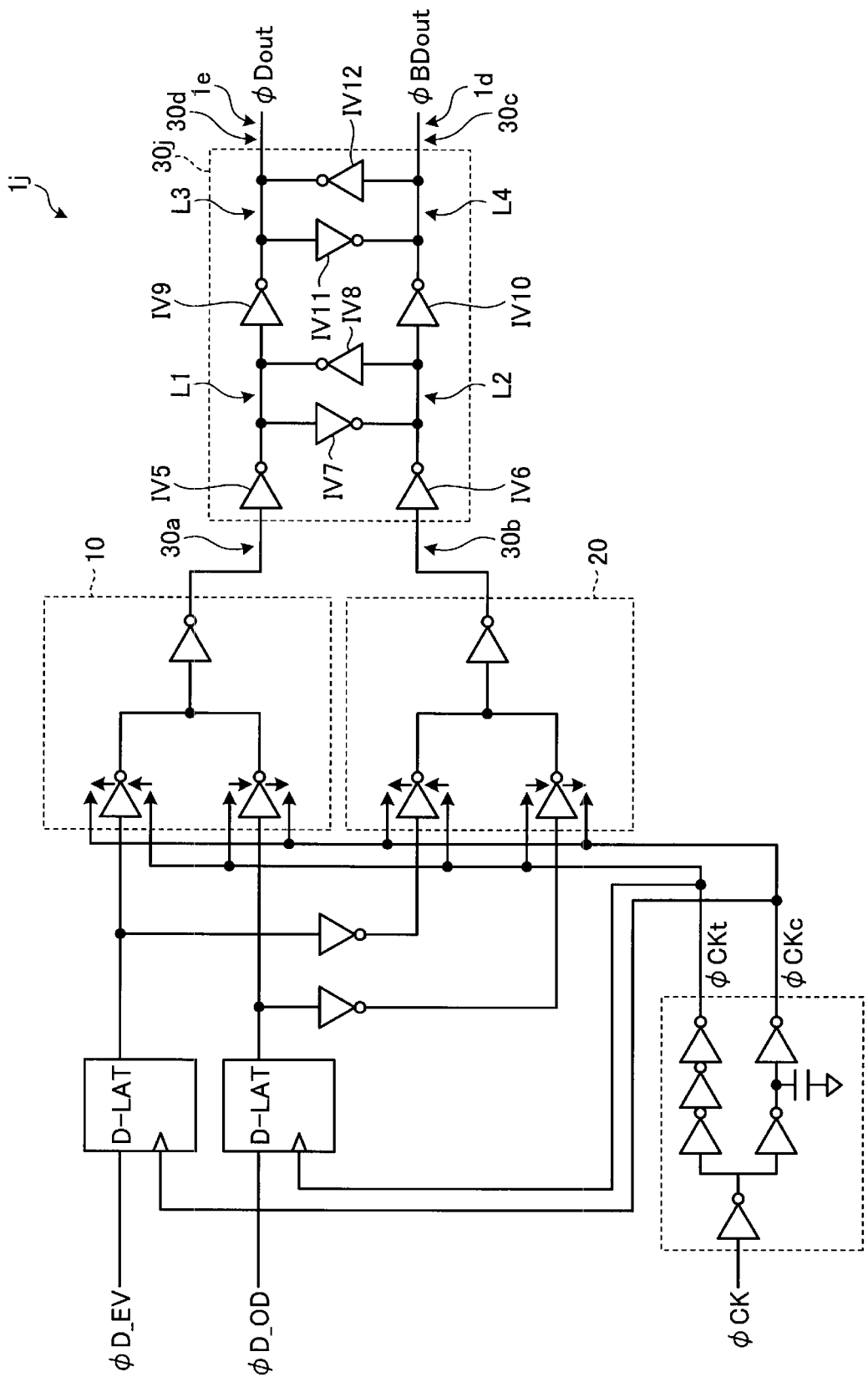
FIG. 6 is a circuit diagram illustrating a configuration of a semiconductor device according to another modification example of at least one embodiment.

Alternatively, as illustrated in FIG. 6, a semiconductor device 1j can be structured to adjust the duty ratio with a high degree of accuracy. In the semiconductor device 1j, a comparison circuit 30j can be configured with, instead of the comparator CP (a differential amplifier) illustrated in FIG. 1, a plurality of inverters of the "back-to-back" configuration having two stages. FIG. 6 is a circuit diagram illustrating a configuration of the semiconductor device 1j according to another modification example of the embodiment.

The comparison circuit 30j further includes a plurality of inverters IV9, IV10, IV11, and IV12 in addition to those of the comparison circuit 30i (see FIG. 5). The inverter IV9 has an input node electrically connected to the output node of the inverter IV5 via the line L1, and an output node electrically connected to a line L3. The line L3 is located at the output side of the inverter IV9. The line L3 electrically connects the output node of the inverter IV9 and the output node 30d of the comparison circuit 30j (the output node 1e of the semiconductor device 1j). Data φDout can be output from the comparison circuit 30j via the output node 30d (output node 1e).

The inverter IV10 has an input node electrically connected to the output node of the inverter IV6 via the line L2, and an output node electrically connected to a line L4. The line L4 is located at the output side of the inverter IV10. The line L4 electrically connects the output node of the inverter IV10 and the output node 30c of the comparison circuit 30j (the output node 1d of the semiconductor device 1j). Data φDout can be output from the comparison circuit 30j via the output node 30c (output node 1d). The data φDout corresponds to data obtained by logically inverting the data φDout.

The inverter IV11 is electrically inserted between the line L3 and the line L4 in a first polarity. The first polarity can be set to a polarity in which, for example, the input node of the inverter IV11 is electrically connected to the line L3 and the output node of the inverter IV11 is electrically connected to the line L4.

The inverter IV12 is electrically inserted between the line L3 and the line L4 in a second polarity. The second polarity is a polarity reverse to the first polarity and can be set to a polarity in which, for example, the output node of the inverter IV12 is electrically connected to the line L3 and the input node of the inverter IV12 is electrically connected to the line L4.

In this way, in the semiconductor device 1j, the comparison circuit 30j is configured with a plurality of inverters of the "back-to-back" configuration having two stages. This enables increasing the accuracy of a comparison operation in the comparison circuit 30j, and, therefore, enables readily bringing the duty ratio of the data φDout obtained by combination closer to about 50% and adjusting the duty ratio of the data φDout with a high degree of accuracy.

Figure 7:
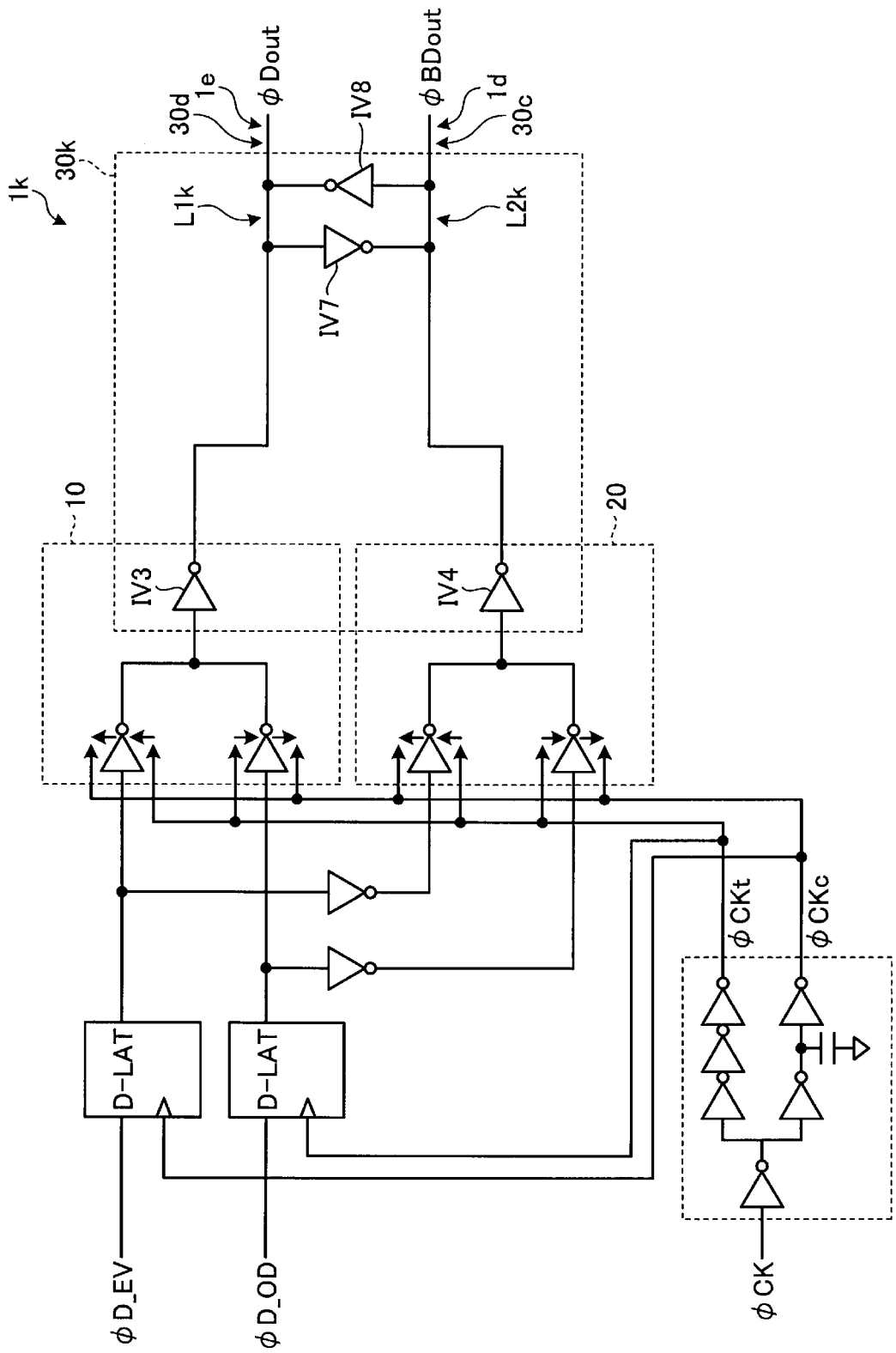
FIG. 7 is a circuit diagram illustrating a configuration of a semiconductor device according to yet another modification example of at least one embodiment.

Alternatively, as illustrated in FIG. 7, a semiconductor device 1k can be structured to reduce the circuit area. In the semiconductor device 1k, a comparison circuit 30k is configured to have a "back-to-back" configuration while sharing the inverters IV3 and IV4 with the selectors 10 and 20. FIG. 7 is a circuit diagram illustrating a configuration of the semiconductor device 1k according to yet another modification example of the embodiment.

The comparison circuit 30k is configured by omitting a plurality of inverters IV5 and IV6 from the comparison circuit 30i (see FIG. 5). The inverter IV3 has an output node electrically connected to a line L1k. The line L1k is located at the output side of the inverter IV3. The line L1k electrically connects the output node of the inverter IV3 and an output node 30d of the comparison circuit 30k (an output node 1e of the semiconductor device 1k). Data φDout can be output from the comparison circuit 30k via the output node 30d (output node 1e).

The inverter IV4 has an output node electrically connected to a line L2k. The line L2k is located at the output side of the inverter IV4. The line L2k electrically connects the output node of the inverter IV4 and an output node 30c of the comparison circuit 30k (an output node 1d of the semiconductor device 1k). Data φDout can be output from the comparison circuit 30k via the output node 30c (output node 1d). The data φDout corresponds to data obtained by logically inverting the data φDout.

The inverter IV7 is electrically inserted between the line L1k and the line L2k in a first polarity. The first polarity can be set to a polarity in which, for example, the input node of the inverter IV7 is electrically connected to the line L1k and the output node of the inverter IV7 is electrically connected to the line L2k.

The inverter IV8 is electrically inserted between the line L1k and the line L2k in a second polarity. The second polarity is a polarity reverse to the first polarity and can be set to a polarity in which, for example, the output node of the inverter IV8 is electrically connected to the line L1k and the input node of the inverter IV8 is electrically connected to the line L2k.

In this way, in the semiconductor device 1k, the comparison circuit 30k is configured to have a "back-to-back" configuration while sharing the inverters IV3 and IV4 with the selectors 10 and 20. With this, the semiconductor device 1k can be configured with a less number of inverters and the circuit area of the semiconductor device 1k can be readily reduced.

Figure 8:
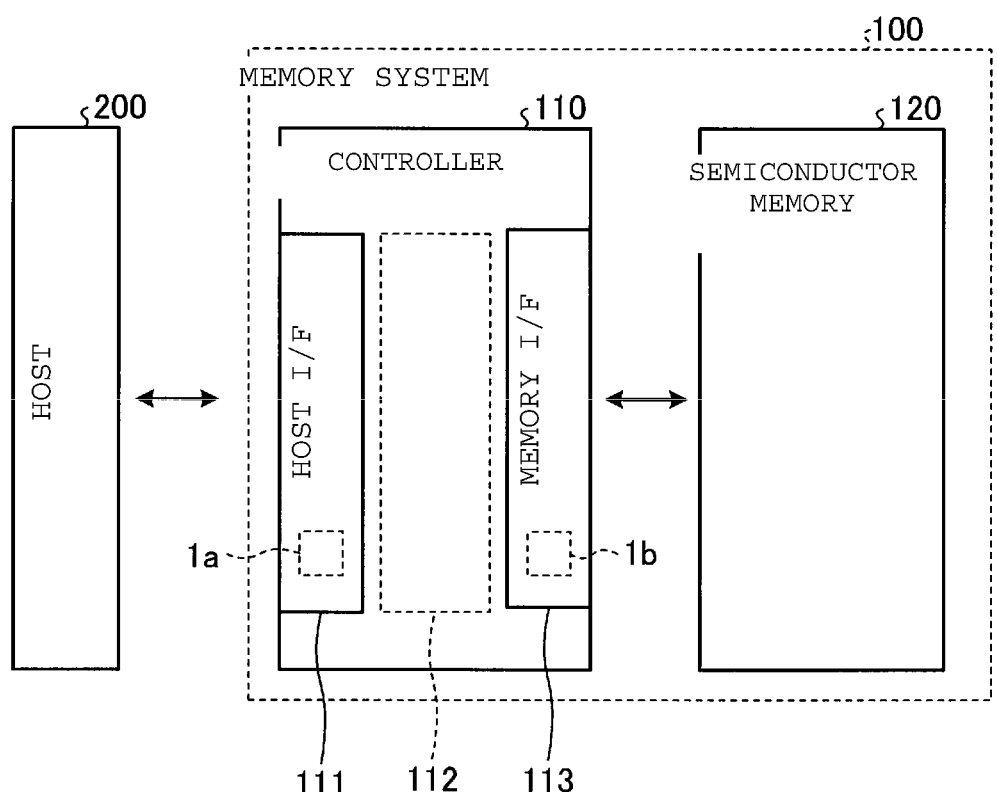
FIG. 8 is a diagram illustrating a configuration of a memory system to which a semiconductor device according to at least one embodiment is applied.

Next, a memory system 100 to which a level-shift circuit is applied is described with reference to FIG. 8. FIG. 8 is a diagram illustrating a configuration of the memory system 100, to which the semiconductor device according to at least one embodiment or a modification example thereof is applied.

The memory system 100 is connectable to a host 200 and is capable of functioning as an external storage medium of the host 200. The host 200 may be, for example, a personal computer, and the memory system 100 may be, for example, a solid state drive (SSD). The memory system 100 includes a controller 110 and a semiconductor memory 120. The controller 110 is a circuit serving as hardware, and includes a host interface (host I/F) 111, a signal processing circuit 112, and a memory interface (memory I/F) 113.

For example, the host I/F 111 includes a semiconductor device 1a. Any semiconductor device according to at least one embodiment or a modification example thereof can be used as the semiconductor device 1a. The host I/F 111 receives predetermined data from the host 200. The host I/F 111 generates, from the predetermined data, data ϕD_EV acquired on the even-numbered edge in a clock (falling of the clock) and data ϕD_OD acquired on the odd-numbered edge in the clock (rising of the clock), and transfers the data ϕD_EV and the data ϕD_OD to the semiconductor device 1a. The semiconductor device 1a, to which a reference clock ϕCK is input, combines the transferred two pieces of data (data ϕD_EV and data ϕD_OD) using the reference clock ϕCK to generate data to be used by the signal processing circuit 112 or the semiconductor memory 120. With this, the data obtained by combination can be appropriately used by the signal processing circuit 112 or the semiconductor memory 120.

Moreover, the memory I/F 113 includes a semiconductor device 1b. Any semiconductor device according to the embodiment or a modification example thereof can be used as the semiconductor device 1b. The memory I/F 113 receives predetermined data from the signal processing circuit 112. The memory I/F 113 generates, from the predetermined data, data ϕD_EV acquired on the even-numbered edge in a clock (falling of the clock) and data ϕD_OD acquired on the odd-numbered edge in the clock (rising of the clock), and transfers the data ϕD_EV and the data ϕD_OD to the semiconductor device 1b. The semiconductor device 1b, to which the reference clock ϕCK is input, combines the two pieces of data using the reference clock ϕCK to generate data to be used by the semiconductor memory 120. With this, the data obtained by combination can be appropriately used by the semiconductor memory 120.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first clocked inverter electrically connected to a first node wherein first data are input to the first node, the first clocked inverter being configured to respond to a first transition of a reference clock;
   a second clocked inverter electrically connected to a second node wherein second data are input to the second node, the second clocked inverter being configured to respond to a second transition of the reference clock, the second transition being an opposite transition than the first transition;
   a first inverter electrically connected to the first node;
   a second inverter electrically connected to the second node;
   a third clocked inverter electrically connected to an output node of the first inverter, and configured to respond to the first transition of the reference clock;
   a fourth clocked inverter electrically connected to an output node of the second inverter, and configured to respond to the second transition of the reference clock;
   a third inverter electrically connected to an output node of the first clocked inverter and an output node of the second clocked inverter;
   a fourth inverter electrically connected to an output node of the third clocked inverter and an output node of the fourth clocked inverter; and
   a comparison circuit electrically connected to an output node of the third inverter and an output node of the fourth inverter.

2. The semiconductor device according to claim 1, further comprising:
   a first latch circuit configured to supply the first data to the first node; and
   a second latch circuit configured to supply the second data to the second node.

3. The semiconductor device according to claim 1, wherein the comparison circuit includes a comparator having a non-inverting input terminal electrically connected to the output node of the third inverter and an inverting input terminal electrically connected to the output node of the fourth inverter.

4. The semiconductor device according to claim 3, wherein the comparator includes a differential amplifier.

5. The semiconductor device according to claim 1, wherein the comparison circuit includes:
   a fifth inverter electrically connected to the output node of the third inverter;
   a sixth inverter electrically connected to the output node of the fourth inverter;
   a seventh inverter electrically inserted between a first line located at an output side of the fifth inverter and a second line located at an output side of the sixth inverter in a first polarity; and
   an eighth inverter electrically inserted between the first line and the second line in a second polarity reverse to the first polarity.

6. The semiconductor device according to claim 5, wherein the comparison circuit further includes:
   a ninth inverter electrically connected to the first line;
   a tenth inverter electrically connected to the second line;
   an eleventh inverter electrically inserted between a third line located at an output side of the ninth inverter and a fourth line located at an output side of the tenth inverter in the first polarity; and
   a twelfth inverter electrically inserted between the third line and the fourth line in the second polarity.

7. The semiconductor device according to claim 1, wherein the comparison circuit includes:
   a fifth inverter electrically inserted between a first line located at an output side of the third inverter and a second line located at an output side of the fourth inverter in a first polarity; and
   a sixth inverter electrically inserted between the first line and the second line in a second polarity reverse to the first polarity.

8. The semiconductor device according to claim 1, further comprising a generation circuit configured to generate a first clock obtained by inverting the reference clock and a second clock obtained by not inverting the reference clock,
   wherein the first clocked inverter has a clock node at a first side which receives the first clock and a clock node at a second side which receives the second clock,
   wherein the second clocked inverter has a clock node at the first side which receives the second clock and a clock node at the second side which receives the first clock,
   wherein the third clocked inverter has a clock node at the first side which receives the first clock and a clock node at the second side which receives the second clock, and
   wherein the fourth clocked inverter has a clock node at the first side which receives the second clock and a clock node at the second side which receives the first clock.

9. The semiconductor device according to claim 8, wherein the generation circuit includes a first chain circuit configured to provide the first clock, and a second chain circuit configured to provide the second clock.

10. The semiconductor device according to claim 9, wherein each of the first chain circuit and the second chain circuit include a plurality of inverters connected sequentially in series, respectively.

11. A memory system comprising:
   a semiconductor memory; and
   a controller including an interface circuit that includes a semiconductor device, and configured to control the semiconductor memory,
   the semiconductor device comprising:
   a first clocked inverter electrically connected to a first node wherein first data are input to the first node, the first clocked inverter being configured to respond to a first transition of a reference clock,
   a second clocked inverter electrically connected to a second node wherein second data are input to the second node, the second clocked inverter being configured to respond to a second transition of the reference clock; the second transition being an opposite transition than the first transition;
   a first inverter electrically connected to the first node;
   a second inverter electrically connected to the second node;
   a third clocked inverter electrically connected to an output node of the first inverter, and configured to respond to the first transition of the reference clock;
   a fourth clocked inverter electrically connected to an output node of the second inverter, and configured to respond to the second transition of the reference clock;
   a third inverter electrically connected to an output node of the first clocked inverter and an output node of the second clocked inverter;
   a fourth inverter electrically connected to an output node of the third clocked inverter and an output node of the fourth clocked inverter; and
   a comparison circuit electrically connected to an output node of the third inverter and an output node of the fourth inverter.

12. The memory system according to claim 11, the semiconductor device further comprising:
   a first latch circuit configured to supply the first data to the first node; and
   a second latch circuit configured to supply the second data to the second node.

13. The memory system according to claim 11, wherein the comparison circuit includes a comparator having a non-inverting input terminal electrically connected to the output node of the third inverter and an inverting input terminal electrically connected to the output node of the fourth inverter.

14. The memory system according to claim 13, wherein the comparator includes a differential amplifier.

15. The memory system according to claim 11, wherein the comparison circuit includes:
   a fifth inverter electrically connected to the output node of the third inverter;
   a sixth inverter electrically connected to the output node of the fourth inverter;
   a seventh inverter electrically inserted between a first line located at an output side of the fifth inverter and a second line located at an output side of the sixth inverter in a first polarity; and
   an eighth inverter electrically inserted between the first line and the second line in a second polarity reverse to the first polarity.

16. The memory system according to claim 15, wherein the comparison circuit further includes:
   a ninth inverter electrically connected to the first line;
   a tenth inverter electrically connected to the second line;
   an eleventh inverter electrically inserted between a third line located at an output side of the ninth inverter and a fourth line located at an output side of the tenth inverter in the first polarity; and
   a twelfth inverter electrically inserted between the third line and the fourth line in the second polarity.

17. The memory system according to claim 11, wherein the comparison circuit includes:
   a fifth inverter electrically inserted between a first line located at an output side of the third inverter and a second line located at an output side of the fourth inverter in a first polarity; and
   a sixth inverter electrically inserted between the first line and the second line in a second polarity reverse to the first polarity.

18. The memory system according to claim 11, the semiconductor device further comprising a generation circuit configured to generate a first clock obtained by inverting the reference clock and a second clock obtained by not inverting the reference clock,
   wherein the first clocked inverter has a clock node at a first side which receives the first clock and a clock node at a second side which receives the second clock,
   wherein the second clocked inverter has a clock node at the first side which receives the second clock and a clock node at the second side which receives the first clock,
   wherein the third clocked inverter has a clock node at the first side which receives the first clock and a clock node at the second side which receives the second clock, and
   wherein the fourth clocked inverter has a clock node at the first side which receives the second clock and a clock node at the second side which receives the first clock.

19. The memory system according to claim 18, wherein the generation circuit includes a first chain circuit configured to provide the first clock, and a second chain circuit configured to provide the second clock.

20. The memory system according to claim 19, wherein each of the first chain circuit and the second chain circuit include a plurality of inverters connected sequentially in series, respectively.

* * * * *